US008816772B2

(12) United States Patent
Sugimoto et al.

(10) Patent No.: US 8,816,772 B2
(45) Date of Patent: Aug. 26, 2014

(54) DIFFERENTIAL AMPLIFIER WITH FUNCTION OF VARIABLE GAIN AND OPTICAL RECEIVER IMPLEMENTED WITH THE SAME

(75) Inventors: Yoshiyuki Sugimoto, Yokohama (JP); Sosaku Sawada, Yokohama (JP); Taizo Tatsumi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 466 days.

(21) Appl. No.: 13/180,752

(22) Filed: Jul. 12, 2011

(65) Prior Publication Data

US 2012/0018622 A1 Jan. 26, 2012

(30) Foreign Application Priority Data

Jul. 20, 2010 (JP) .................................. 2010-163005

(51) Int. Cl.
*H03F 3/45* (2006.01)
(52) U.S. Cl.
USPC ....................................... 330/254; 250/214 A
(58) Field of Classification Search
USPC ................................................. 330/252–261
See application file for complete search history.

(56) References Cited

U.S. PATENT DOCUMENTS 6,657,494 B2 * 12/2003 Twomey ........................ 330/254

FOREIGN PATENT DOCUMENTS

| JP | 61-219208 | 9/1986 |
| JP | 62-245810 | 10/1987 |
| JP | 1-133403 | 5/1989 |
| JP | 05-218767 | 8/1993 |
| JP | 2006-157141 | 6/2006 |

OTHER PUBLICATIONS

Notification of Reasons for Rejection, Jan. 6, 2014.

* cited by examiner

*Primary Examiner* — Hieu Nguyen
(74) *Attorney, Agent, or Firm* — Smith, Gambrell & Russell LLP

(57) ABSTRACT

A differential circuit with a function of a variable gain without shifting the output cross point is disclosed. The differential circuit includes an amplifying stage and a control stage. The amplifying stage includes three units each having a pair of transistors, a pair of load resistors, and a pair of current sources. The second and third units each put between the first unit and the load resistor to bypass the current. The control stage includes two units and two current sources to compensate the current bypassed by the second or third unit to keep the DC output level substantially in constant.

6 Claims, 8 Drawing Sheets

DIFFERENTIAL AMPLIFIER WITH FUNCTION OF VARIABLE GAIN AND OPTICAL RECEIVER IMPLEMENTED WITH THE SAME

BACKGROUND OF THE INVENTION

1. Field of the Invention

The present invention relates to a differential amplifier having a variable gain.

2. Background of the Invention

Various type of differential amplifiers having an arrangement of the variable gain have been well known. For instance, Japanese Patent Applications published as JP-S61-219208A, JP-S62-245810A, and JP-H01-133403, each disclosed a differential amplifier with the variable gain. However, conventional differential amplifiers showed a subject that the cross point of the output shifted as varied the gain thereof.

SUMMARY OF THE INVENTION

An aspect of the present invention relates to a differential circuit with the function to vary the gain but may hold the cross point. The differential circuit of the invention comprises an amplifying stage and a control stage. The amplifying stage includes first to third units, a pair of load resistors, a current source, and a power supply. The control stage includes fourth and fifth units. One of the load resistors, the second unit, the first unit, and the current source, where they are connected in series in this order, constitute the first current path to flow the first current therein between the power supply and a ground. The other of the load resistors, the third unit, the first unit, and the current source, where they are connected in series in this order, constitute the second current path to flow the second current therein between the power supply and the ground.

In the present invention, the second and third units each reduces the first current and the second current, but the forth unit connected to the load resistor may compensate the first current reduced by the second unit, and the fifth unit connected to the other load resistor may compensate the second current reduced by the third unit.

The second and third units may adjust the currents flowing in respective current paths. However, when the current is varied to adjust the gain thereof, the cross point is ordinarily varied synchronous with the change of the gain, which causes distortions in the output. The present invention may compensate those reduced current by the fourth and fifth unit, which may vary the gain without causing substantially any change in the cross point.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments will be described as referring to accompanying drawings. In the description of the drawings, the same numerals or symbols will refer to the same elements without overlapping explanations.

Figure 1:
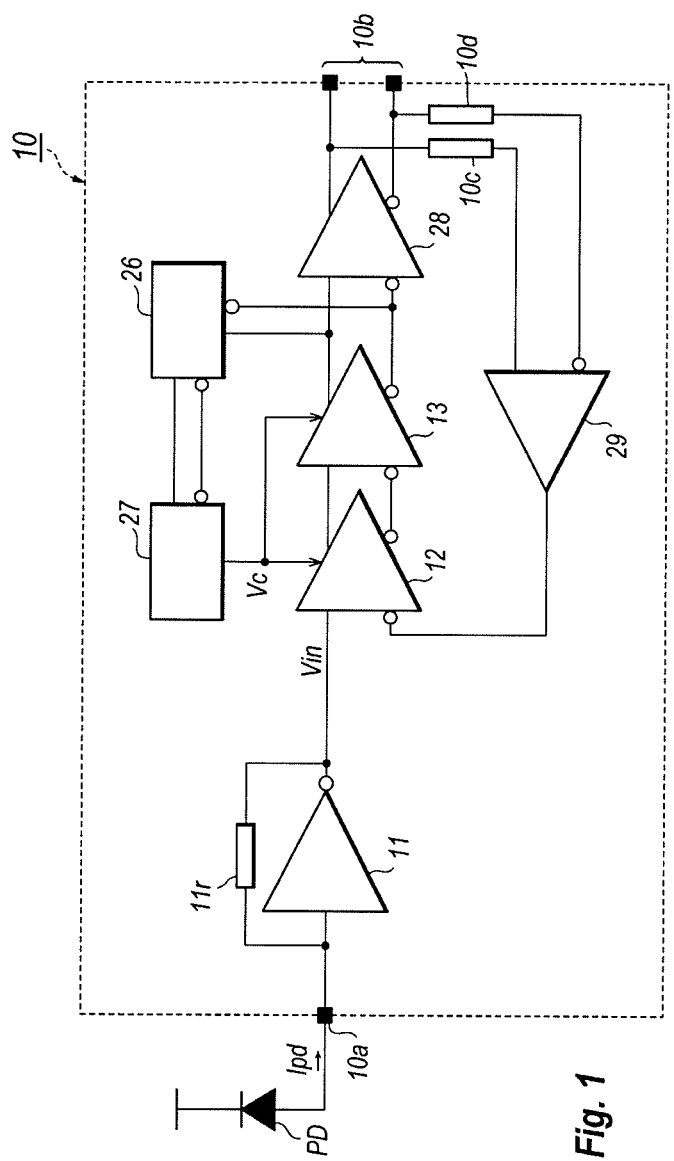
FIG. 1 shows a block diagram of an optical receiver according to an example of the present invention.

FIG. 1 is a block diagram of an optical receiver 10 that includes a differential amplifier having a function of a variable gain according to an embodiment of the present invention. The optical receiver 10 converts a photocurrent Ipd generated by the photodiode (hereafter denoted as PD) into a voltage signal, and amplifies this voltage signal. The optical receiver 10 includes a trans-impedance amplifier (hereafter denoted as TIA) 11, two differential amplifiers, 12 and 13, each of which has a function to vary the gain thereof, a detector 26, a controller 27, another differential amplifier 28 and an offset compensator 29.

Receiving an optical signal that has high frequency components by the PD, the PD generates a photocurrent Ipd reflecting the optical signal. The photocurrent Ipd enters the TIA 11 through an input terminal 10a of the optical receiver 10. The TIA 11 converts the photocurrent Ipd into a voltage signal Vin, which is amplified by amplifiers, 12 and 13, both of which has a function of the variable gain. Then, the amplified signal output from the differential amplifier 13 is further amplified by the final differential amplifier 28 to be output from the output terminals 10b of the optical receiver 10.

The detector 26 detects the magnitude of the signal output from the differential amplifier 13. The information concerning to the amplitude is fed back to the controller 27. The controller 27, based on the information output from the controller 26, may vary the gain of the differential amplifiers, 12 and 13, by sending a control signal Vc. This control signal Vc may adjust the gain of the differential amplifiers, 12 and 13, so as to set the output of the second differential amplifier 13 in constant in a preset level. The offset compensator 29, by receiving the output of the final differential amplifier 28, may unbalance the input of the first differential amplifier 12 so as to cancel the offset appeared in the output signals of the final differential amplifier 28.

Figure 2:
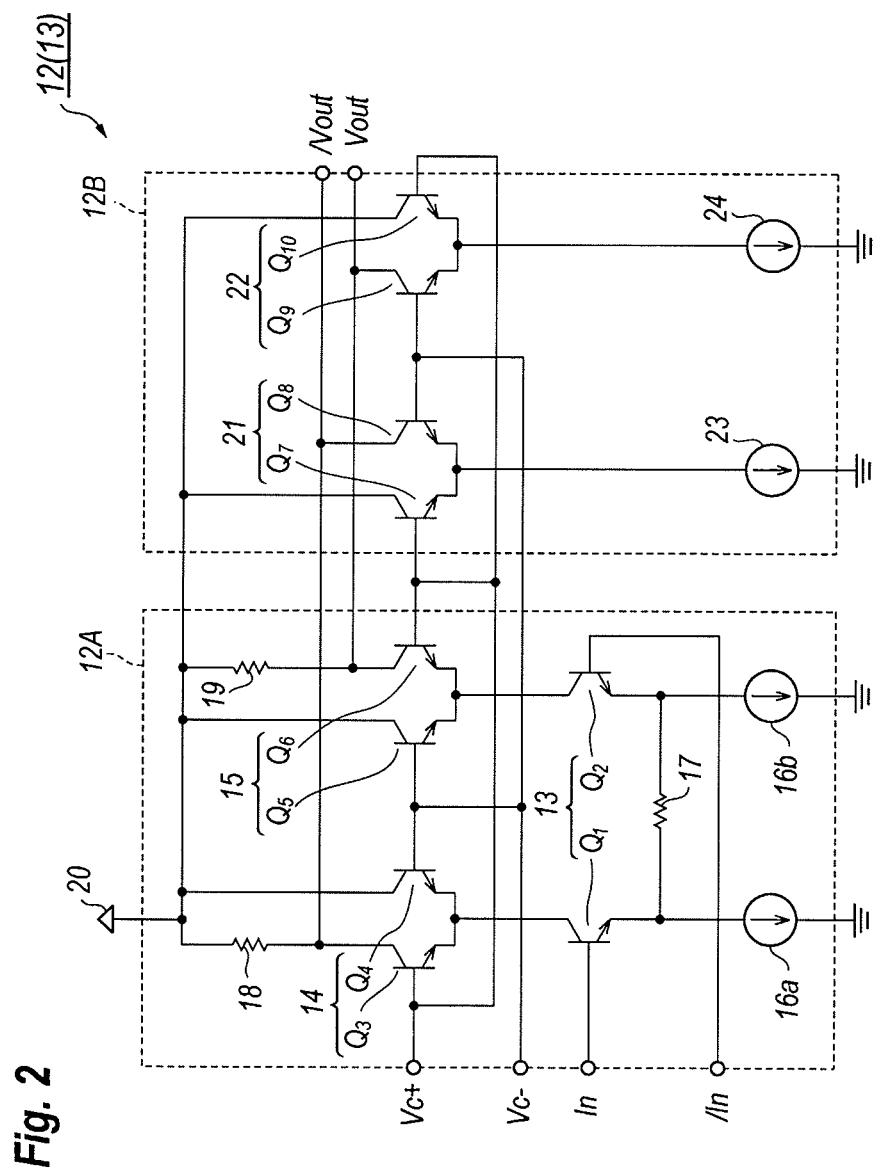
FIG. 2 shows a circuit diagram of the differential amplifier of the present invention.

FIG. 2 is an exemplary circuit diagram of two differential amplifiers, 12 or 13. The differential amplifier 12 according to the present invention includes an amplifying stage 12A and a control stage 12B. The amplifying stage 12A includes first to third differential units, 13 to 15, and two current sources, 16a and 16b.

The first differential unit 13 comprises two transistors, $Q_1$ and $Q_2$, whose emitters are connected through a resistor 17. The emitter of the former transistor $Q_1$ is grounded through the first current source 16a, while, that of the latter transistor $Q_2$ is grounded through the second current source 16b. The first differential unit 13 receives the signal Vin output from the TIA 11 and the offset control signal output from the offset compensator 29 in the base of respective transistors, $Q_1$ and $Q_2$. When the circuit diagram shown in FIG. 2 corresponds to the second differential amplifier 13, the first differential unit 13 receives signals complementary to the others which are output from the first differential amplifier 12.

The second differential unit 14 is comprised of two transistors, $Q_3$ and $Q_4$, emitters of which are commonly connected to the collector of the transistor $Q_1$ in the first differential unit 13. The collector of one of the transistor is biased by the power supply 20 through a load resistor 18; while, the collector of the other transistor $Q_3$ is directly biased by the power supply 20.

The third differential unit 15 is comprised of two transistors, $Q_5$ and $Q_6$, emitters of which are commonly connected to the collector of the transistor $Q_2$ in the first differential unit 13. The collector of the first transistor $Q_5$ is directly biased by the power supply 20; while, the collector of the other transistor $Q_6$ is also biased by the power supply 20 but through a load resistor 19.

The second and third differentia units, 14 and 15, are complementarily driven by the gain controlling signals, Vc+ and Vc−. That is, the transistor $Q_3$ in the second unit 14 and the transistor $Q_6$ in the third unit 15 commonly receive one of control signals Vc+ in the bases thereof; while, the transistor $Q_4$ in the second unit 14 and the transistor $Q_{15}$ in the third unit 15 commonly receives another control signal Vc− complimentary to the former control signal Vc+.

The control stage 12B comprises fourth and fifth differential units, 21 and 22, and two current sources, 23 and 24. The fourth differential unit 21 comprises two transistors, $Q_7$ and $Q_8$, emitters of which are commonly grounded through the current source 23. The corrector of the former transistor $Q_7$ is directly biased by the power supply; while, the collector of the other transistor $Q_8$ is coupled with the power supply through the first load resistor 18.

The fifth transistor pair 22 is comprised of two transistors, $Q_9$ and $Q_{10}$, emitters of which are commonly grounded through the other current source 24. The collector of the former transistor $Q_9$ is coupled with the power supply through the second load resistor 19, that is, the collector of the former transistor $Q_9$ is coupled with one of the outputs; while, the collector of the latter transistor $Q_{10}$ is directly biased by the power supply 20. Two differential units, 21 and 22, are also driven by the control signals, Vc+ and Vc−. That is, the base of the transistors, $Q_7$ and $Q_{10}$, receives the first control signal Vc+, while, the base of the transistors, $Q_8$ and $Q_9$, receives the second control signal Vc− complementary to the first control signal Vc+.

In the present embodiment, the transistors, $Q_1$ to $Q_{10}$ preferably have the type of the npn transistor, in particular, have the type of the npn hetero-bipolar transistor.

Next, the operation of the differential amplifier, 12 or 13, will be described.

Figure 3:
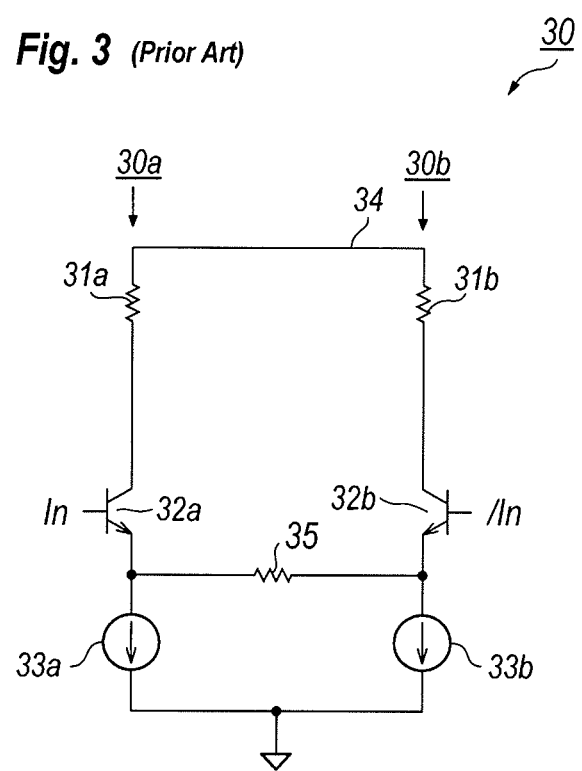
FIG. 3 shows a fundamental differential circuit with a variable gain function.

FIG. 3 shows a fundamental differential circuit that has the function to vary the gain thereof. The circuit 30 shown in FIG. 3 includes two current paths, 30a and 30b. The former path 30a includes a load resistor 31a, a transistor 32a and a current source 33a, each of which are connected in series between the power supply 34 and the ground. The transistor 32a is one of transistors of the differential unit. The other current path 30b has the arrangement same with those of the first current path 30a. The transistors, 32a and 32b, each receive signals, In and /In; where a character "/" means that the signal has the opposite phase. The collector of respective transistors, 32a and 32b, output the complementary signals to each other.

Figure 4:
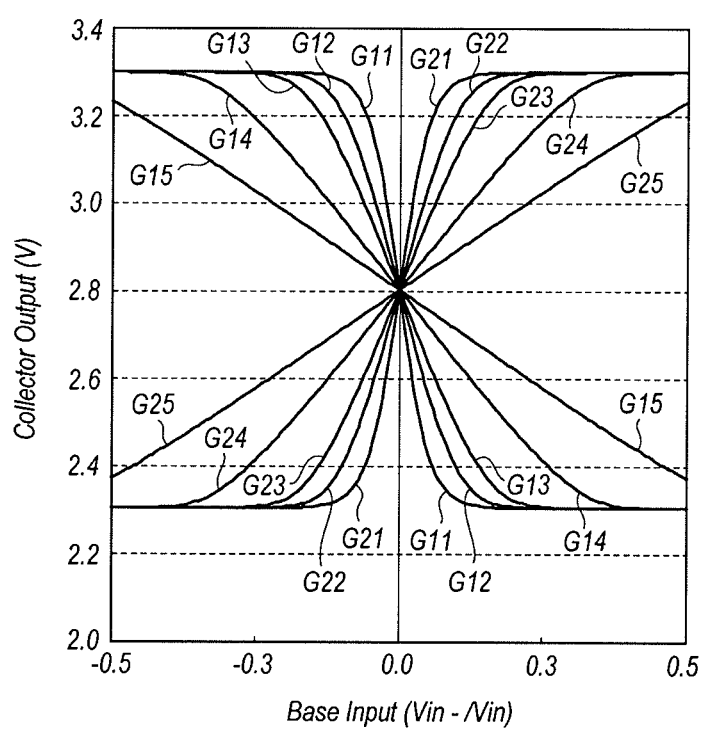
FIG. 4 shows transfer curves of the circuit shown in FIG. 3.

The voltage gain of this fundamental circuit may be varied by adjusting resistance of an emitter resistor 35 connected between emitters of the transistor, 32a and 32b. FIG. 4 shows transfer curves of the fundamental circuit 30 shown in FIG. 3 as varying the resistance of the emitter resistor 35. The horizontal axis shows the base input, while, the vertical axis corresponds to the collector output. Behaviors G11 to G15 are the collector output of the transistor 32a, while, behaviors G21 to G25 are for the collector output of the other transistor 32b. These behaviors correspond to the resistance of the emitter resistor of 0, 100, 200, 500, and 1000 Ω, respectively. The power supply is set to be 3.3 V; while, two current sources, 33a and 33b, generate a current of 0.5 mA, respectively.

When the emitter resistor is 0 Ω, that is, the circuit has the arrangement of the complete differential circuit, no current flows in one of the transistor 32, which sets the collector output thereof equal to the power supply; while, a whole current provided from two current sources, 33a and 33b, flows in the other transistor, which lowers the collector output. Assuming the resistance of the load resistor, 31a and 32a, is 1 kΩ, the collector output becomes 3.3−1 mA×1 kΩ=2.3 V. Then, the transfer curve is given by G11 and G21.

When the emitter resistor has substantial resistance, a portion of the current from the current source 33a causes a current feedback to raise the emitter level of the transistor 32b, which lowers the base bias, namely, the base-emitter voltage. However, the collector output of the transistor 32b, namely, the high and low levels thereof, may be determined by the sum of two currents from the current sources, 33a and 33b, the current feedback function above described only changes the gain of the differential circuit 30, which are shown in behaviors G12 to G15 and G22 to G25 in FIG. 4.

The emitter resistor 35 shown in FIG. 3 is necessary to flow the current bi-directionally. It is hard to cope with both the dynamically variable resistance and the bi-directionally flowing current. A bipolar transistor may realize the former function of the dynamically variable resistance but substantially impossible to show the latter function of the bi-directionally flowing current. Even when one type of a transistor may cope with both functions, the operating range of this transistor would be strictly limited to a point. A combination of a MOS-switch and a resistor gives a solution for the subject above. However, any MOS device is not available in compound semiconductor materials.

Figure 5:
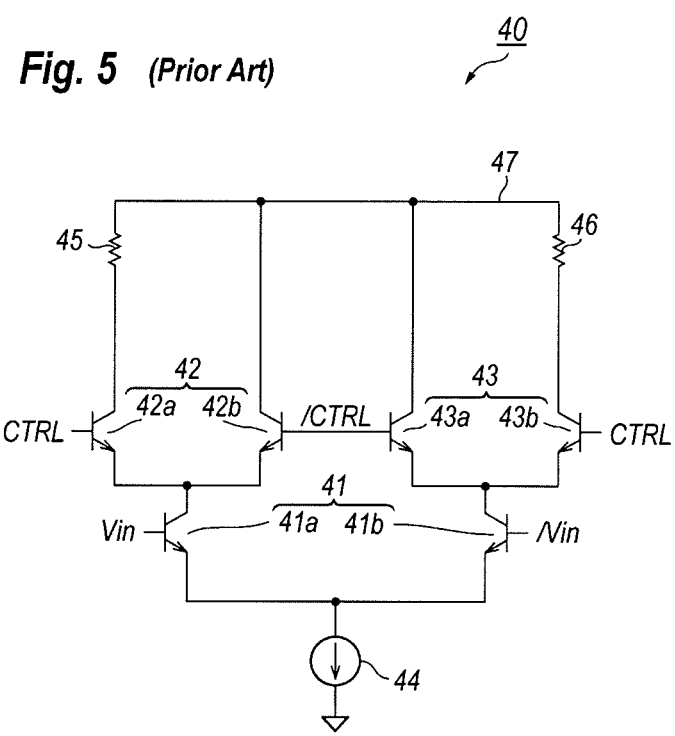
FIG. 5 shows another fundamental differential circuit with a variable gain function.

The present embodiment provides an arrangement of a differential amplifier without any active resistor between the emitters of the transistor of the input unit. FIG. 5 is another comparative circuit to vary the gain of the differential amplifier. The differential circuit 40 shown in FIG. 5 has an arrangement similar to those of the amplifying stage 12A of FIG. 2. That is, the differential circuit 40 of FIG. 5 includes three differential units, 41 to 43, and the current source 44. The first differential unit includes two transistors, 41a and 41b, whose emitters are commonly connected to the current source 44. This first differential unit 41 receives the input signals, In and /In, complementary to the others by the bases thereof. The second differential unit 42 also includes two transistors, 42a and 42b, respective emitters of which are commonly connected to the collector of the transistor 41a in the first pair. One of the transistor 42a is biased in the collector thereof by the power supply 47 through a load resistor 45, while, the other transistor 42b is directly biased by the power supply in the collector thereof. The third differential unit 43 has an arrangement substantially same with those of the differential unit 42. Moreover, the second and third differential units, 42 and 43, are differentially driven by control signals, CTRL and /CTRL, complementary to each other.

Figure 6:
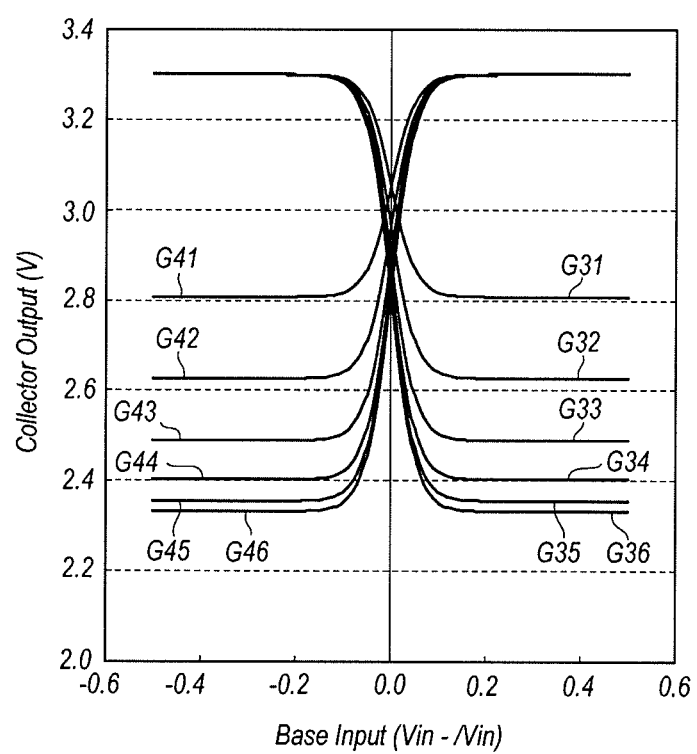
FIG. 6 shows transfer curves of the circuit shown in FIG. 5.

Adjusting the control signals, CTRL and /CTRL, the gain of the differential circuit 40 may be varied. That is, varying the controls signals, CTRL and /CTRL, relatively to each other, the current flowing in paths to which a series circuit comprised of the load resistor, 45 or 46, and the transistor, 42a or 43b, may be varied. FIG. 6 shows transfer curves of the differential circuit 40. Behaviors G31 to G36 are the collector output of the transistor 42a, while, behaviors G41 to G46 are those of the transistor 43b, when the relative level of the control signals, namely (CTRL-/CTRL) is varied from 0 to 0.1 V. Behaviors, G31 and G41, correspond to the relative bias level of 0 V, while, behaviors, G36 and G46, corresponds to the relative bias level of 0.1 V. The power supply 47, the current source 44, and the load resistors, 45 and 46, are assumed to be 3.3 V, 1 mA, and 1 kΩ, respectively.

The differential circuit 40 flows the current determined by the current source 44 in transistors, 42b and 43a, when the control signals, CTLR and /CTRL, negatively biases the transistors, 42a and 43b, which turns off two transistors, 42a and 43b, and no voltage drop occurs in the load resistors, 45 and 46. On the other hand, when the control signals, CTRL and /CTRL, positively biases the transistors, 42a and 43b, which turns on the transistors, 42a and 43b, and turns off the other transistors, 42b and 43a; the almost whole current flows in these transistors, 42a and 43b, and the substantial voltage drop occurs in the load resistors, 45 and 46, which lowers the collector output. When the current source 44 and the load resistor, 45 and 46, are 1 mA and 1 kΩ, respectively; the voltage drop at the load resistors, 45 and 46, becomes 1 V and the collector output level is 2.3 V. The gain of the differential circuit is ordinarily given by a slope at the cross point. Accordingly, the gain increase as the control signal CTRL increases.

Figure 7:
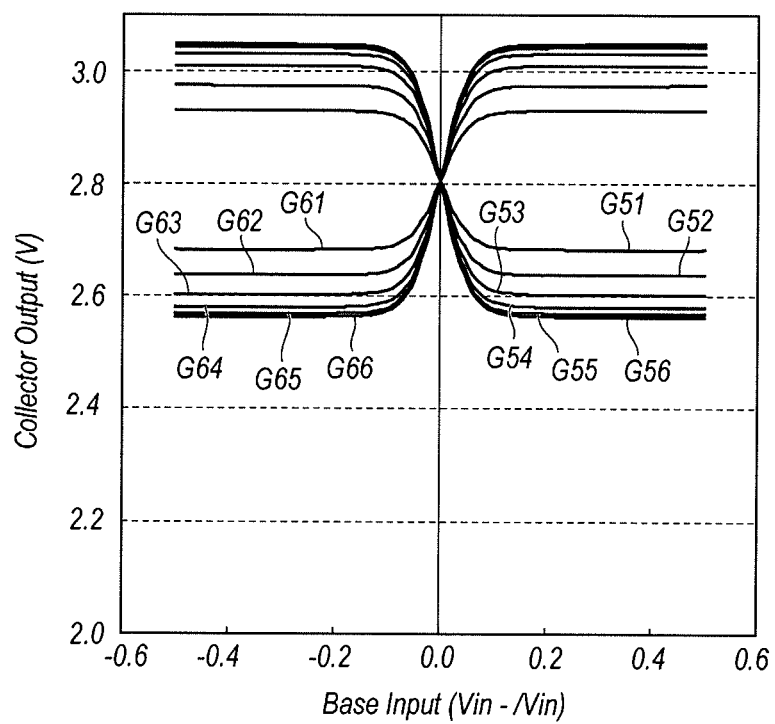
FIG. 7 shows transfer curves of the circuit with functions of the variable gain shown in FIG. 5 but accompanying with another function of the stable cross point.

However, the differential circuit 40 varies the collector output level, in particular, the low level of the collector output, as varying the control signals, CTRL and /CTRL, as shown behaviors G31 to G36 and those of G41 to G46 shown in FIG. 6. The level shifts shown in FIG. 6 also causes the shift of the cross point. Thus, the differential circuit 40 is inadequate to be applied to the communication system. A Japanese Patent Application published as JP-S61-219208A has disclosed a solution to the subject above described. That is, an additional circuit including a current adder and a current extractor adds/extracts a supplemental current to/from the load resistor, which may decrease the high level and increase the low level of the collector output. Thus, the cross point may be set substantially in constant as shown in FIG. 7.

A differential circuit 12(13) according to an embodiment of the present invention shown in FIG. 2 includes the control stage 12B in the downstream of the amplifying stage 12A which has an arrangement substantially same with the differential circuit 40 shown in FIG. 5. Referring to FIG. 2 again, the current flowing in the load resistor 18(19) is given by:

$$IQ_6+IQ_9=(I_{CS}-i_{IN})/\{1+\exp(-\Delta V/V_T)\}+I_{CS}/\{1+\exp(\Delta V/V_T)\}=I_{CS}\cdot\{1+\exp(\Delta V/V_T)\}/\{2+\exp(-\Delta V/V_T)+\exp(\Delta V/V_T)\}\times i_{IN}=I_{CS}-f(\Delta V,T)\times i_{IN}$$

wherein $IQ_6$ and $IQ_9$ are currents flowing in the transistors, $Q_6$ and $Q_9$, respectively; $I_{CS}$ is the total current determined by the current sources, 16a and 16b; $i_{IN}$ is a current caused by the input signals, In and /In; and $\Delta V$ is the relative control signal, (Vc+−Vc−).

As explicitly appeared in equation above, the current flowing in the load resistor 18(19) may be divided in two parts, one of which only includes the DC component $I_{CS}$ by the current source, while, the other only includes the AC component $i_{IN}$ by the input signal Vin(/Vin). Accordingly, even the control signals, Vc+ and Vc−, vary relatively to each other to adjust the AC gain of the amplifier; the DC component in the output Vout may be kept constant.

The operating mechanism described above is further specifically explained. In the differential circuit 12, the gain control signals, Vc+ and Vc−, determine a valid component and a waste component of the current flowing in the transistors, $Q_6$ and $Q_9$, that is, the current flowing in the transistor $Q_6$ is the valid component, while, the current flowing in the other transistor $Q_9$ is the waste component for the input signal Vin(/Vin). However, the sum of two components is inevitably constant to be equal to a sum of the currents by respective current sources, 16a and 16b.

The control signals, Vc+ and Vc−, are oppositely connected in the amplifying stage 12A and the control stage 12B; that is, concentrating on the fourth differential unit 21 comprising two transistors, $Q_7$ and $Q_8$, the transistor $Q_7$ that receives the positive control signal Vc+ flows the valid current therein but the collector thereof is directly connected to the power supply 20. On the other hand, the other transistor $Q_8$ that receives the negative control signal Vc− provides the waste current therein and the collector thereof is connected to the load resistor 18. The valid current by the transistor $Q_3$ and the waste current by the transistor $Q_8$ always flow in the load resistor 18, then, the voltage drop due to these current becomes constant.

Figure 8:
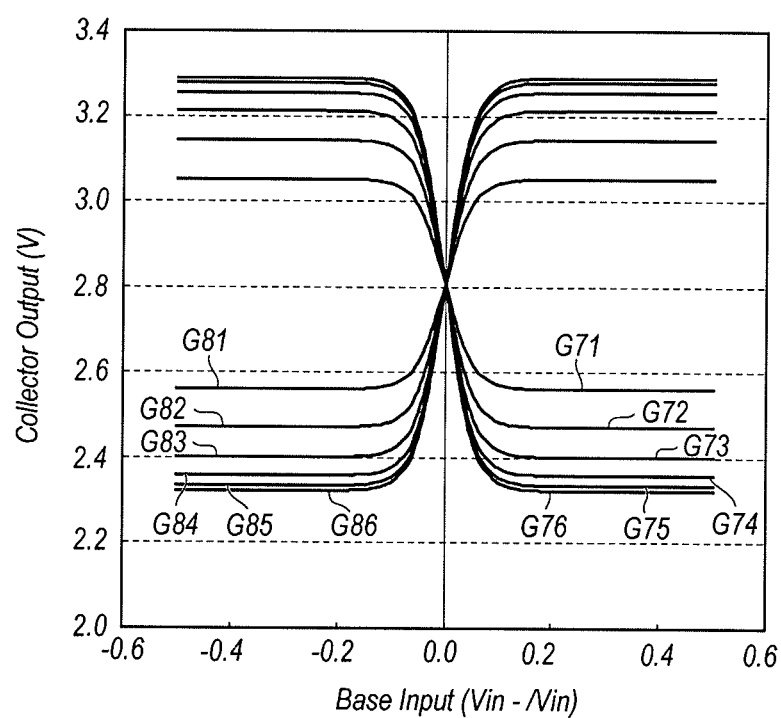
FIG. 8 shows transfer curves of the circuit shown in FIG. 2 according to an embodiment of the present invention.

FIG. 8 shows transfer curves of the differential amplifier 12(13). The horizontal axis of FIG. 8 corresponds to a difference between base biases (Vin−/Vin), while, the vertical axis shows the collector output levels. Behaviors, G71 to G76, are collector outputs of the transistor $Q_3$, and behaviors, G81 to G86, are the collector outputs of the other transistor $Q_6$, as the base biases varies from 0 to 0.1 V by a step of 0.02 V. The power supply 20, the current sources, 16a and 16b, and the resistance of the load resistors, 18 and 19, are assumed to be 3.3 V, 0.5 mA, and 1 kΩ, respectively.

FIG. 8 shows relatively larger amplitudes between two levels compared with those indicated in FIG. 7. This is because the waste current is extracted from the load resistor through a bypass resistor, and the voltage drop at this bypass resistor reduces the amplitude of the collector output levels in the results of FIG. 7. A load resistor viewed from the transistor becomes a parallel circuit of the original load resistor coupled to the power supply and this bypass resistor. Accordingly, the voltage gain of the differential circuit decreases when the resistance of the bypass resistor is set smaller so as to get the collector output levels.

While, in the differential circuit 12 according to the present embodiment, the load resistor viewed from the transistor, $Q_3$ and $Q_6$, shown in FIG. 2, becomes a parallel circuit of the original load resistor, 18 or 19, and collector impedance of the transistor, $Q_8$ or $Q_9$, which is far greater than the resistance of the original resistor, 18 or 19; accordingly, the impedance of the load resistor may be substantially kept constant.

Moreover, the conventional differential amplifier having an architecture described above is necessary for the power supply to compensate the voltage drop at the bypass resistor, which inevitably raises a barrier against the trend of the lower power supply as possible.

The differential amplifier 12(13) preferably sets the current of the current source 23 and that of another current source 24 in the control stage 12B to be equal to a half of the current $I_{CS}$ which is a sum of the current determined by the current source 16a and that of the other current source 16b. That is, the current of respective current sources, 16a, 16b, 23 and 24 is substantially equal to each other. When the current of the current sources, 23 and 24, in the control stage 12B becomes considerably offset from the current $I_{CS}/2$ in the amplifying stage 12A; not only the cross point of the output level varies following the control signals, Vc+ and Vc−, but the levels thereof becomes asymmetry against the cross point.

The differential circuit 12(13) according to the present embodiment connects the emitters of the first differential unit 13 with the emitter resistor 17. However, the invention may short-circuit the emitter resistor 17 and combine two current sources, 16a and 16b. The emitter resistor 17 may adjust the fundamental voltage gain of the differential circuit 12(13) as described in FIG. 3. The voltage gain determined by the emitter resistor 17 becomes the maximum gain of the differential circuit 12(13), and may be reduced from this maximum gain by adjusting the control signals, Vc+ and Vc−.

Thus, the differential circuit 12(13) according to the present embodiment may effectively suppress the shift of the cross point even when the circuit 12(13) varies the voltage gain thereof without providing additional power supplies or biases to set the cross point. A condition to keep the power supply in low voltages may be easily obtained.

While several embodiments and variations of the present invention are described in detail herein, it should be apparent that the disclosure and teachings of the present invention will suggest many alternative designs to those skilled in the art.

What is claimed is:

1. A differential circuit, comprising:
   an amplifying stage including first to third units, a pair of load resistors, a current source, and a power supply; and
   a control stage including fourth and fifth units,
   wherein one of said load resistors, said second unit, said first unit, and said current source constitute a first current path between said power supply and a ground, and another of said load resistors, said third unit, said first unit, and said current source constitute a second current path between said power supply and said ground,
   wherein said second and third units each reduce a first current flowing in said first path and a second current flowing in said second path, respectively,
   wherein said fourth unit is connected to said second unit and said one of said load resistors to compensate said first current reduced by said second unit, and said fifth unit is connected to said third unit and said other load resistor to compensate said second current reduced by said third unit and,
   wherein said second and third units receive a control signal, and said fourth and fifth units receive a complementary control signal compementary to said control signal, said control signal determining reduction of said first and second currents by second and third units, respectively, said complementary control signal determining compensation of said first and second currents by said fourth and fifth units, respectively.

2. The differential circuit of claim 1,
   wherein each of said first, fourth and fifth units includes a pair of transistors and a current source connected to said transistors, and
   wherein said current source of said fourth unit and said current source of said fifth unit generate a current that is half of a current generated by said current source of said first unit.

3. The differential circuit of claim 1,
   wherein said first and second currents reduced by said second and third units, respectively, and compensated by said fourth and fifth units, respectively, determine a gain of said differential circuit.

4. The differential circuit of claim 1,
   wherein said first unit includes a pair of transistors that receive AC signals complementary to each other, and
   wherein said first current reduced by said second unit and said second current reduced by said third unit determine a gain for said AC signals, and said first current compensated by said fourth unit and said second current compensated by said fifth unit keep a DC level of said differential circuit.

5. A differential circuit comprising:
   an amplifying stage including first to third units, pair of load resistors, current sources, and a power supply; and
   a control stage including fourth and fifth units,
   wherein one of said load resistors, said second unit said first unit, and one of said current sources constitute a first current path between said power supply and a ground, and another of said load resistors, said third unit, said first unit, and another of said current sources constitute a second current path between said power supply and said ground,
   wherein said second and third units each reduce a first current flowing in said first path and a second current flowing in said second path, respectively,
   wherein said fourth unit is connected to said second unit and said one of said load resistors to compensate said first current reduced by said second unit, and said fifth unit is connected to said third unit and said other load resistor to compensate said second current reduced by said third unit, and
   wherein said first unit includes a pair of transistors each grounded through respective of said current sources that are coupled with a resistor that determines a maximum gain of said differential amplifier.

6. The differential circuit of claim 5,
   wherein said control stage includes current sources which each generate a current substantially equal to a current generated by each of said current sources of said amplifying stage.

* * * * *